(12) United States Patent
Yu et al.

(10) Patent No.: US 10,831,074 B2
(45) Date of Patent: Nov. 10, 2020

(54) ARRAY SUBSTRATE, DISPLAY PANEL, AND ELECTRONIC APPARATUS

(71) Applicant: Wuhan China Star Optoelectronics Technology Co., Ltd., Hubei (CN)

(72) Inventors: Pengfei Yu, Guangdong (CN); Jiawei Zhang, Guangdong (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 0 days.

(21) Appl. No.: 16/147,882

(22) Filed: Oct. 1, 2018

(65) Prior Publication Data
US 2019/0235332 A1    Aug. 1, 2019

Related U.S. Application Data

(63) Continuation of application No. PCT/CN2018/096510, filed on Jul. 20, 2018.

(30) Foreign Application Priority Data

Jan. 29, 2018    (CN) .......................... 2018 1 0086461

(51) Int. Cl.
*G09G 3/36* (2006.01)
*G02F 1/1362* (2006.01)
(Continued)

(52) U.S. Cl.
CPC .... *G02F 1/136286* (2013.01); *G02F 1/13452* (2013.01); *G02F 1/133514* (2013.01);
(Continued)

(58) Field of Classification Search
CPC ............ G09G 3/3648; G02F 1/136286; G02F 1/133512; G02F 1/13452
See application file for complete search history.

(56) References Cited

U.S. PATENT DOCUMENTS

2008/0100559 A1*    5/2008    Jackson ............... G09G 3/3266
                                                              345/100
2014/0168552 A1     6/2014    Jo et al.
(Continued)

FOREIGN PATENT DOCUMENTS

CN          101110189 A         1/2008
CN          103454821 A         12/2013
(Continued)

OTHER PUBLICATIONS

1st Office Action of counterpart Chinese Patent Application No. 201810086461.3 dated Nov. 29, 2019.

*Primary Examiner* — Alexander Eisen
*Assistant Examiner* — Cory A Almeida

(57) ABSTRACT

The present disclosure provides an array substrate, a display panel, and an electronic apparatus. The array substrate may include: multiple gate lines each extending along a first linear direction; and multiple data lines each extending along a second linear direction, wherein the multiple gate lines and the multiple data lines are interlaced with each other, the second linear direction is substantially perpendicular to the first linear direction; wherein a notch is defined on the upper edge. By the present disclosure, a wiring path of at least one of the gate lines or at least one of the data lines may avoid the notch. Therefore, a technical problem of uneven distribution of gate lines or data lines and abnormal display image due to the irregular shape of the display panel may be solved.

20 Claims, 5 Drawing Sheets

(51) Int. Cl.
*G02F 1/1345* (2006.01)
*G02F 1/1335* (2006.01)

(52) U.S. Cl.
CPC ....... *G09G 3/3648* (2013.01); *G02F 2201/56* (2013.01); *G09G 2300/0408* (2013.01); *G09G 2310/0297* (2013.01)

(56) References Cited

U.S. PATENT DOCUMENTS

2016/0284262 A1* 9/2016 Qin .................. G02F 1/133305
2018/0067599 A1* 3/2018 Cai ....................... G06F 3/0412

FOREIGN PATENT DOCUMENTS

| | | |
|---|---|---|
| CN | 103926774 A | 7/2014 |
| CN | 107315500 A | 11/2017 |
| CN | 107561806 A | 1/2018 |
| CN | 108181769 A | 6/2018 |
| JP | 2013029775 A | 2/2013 |

* cited by examiner

US 10,831,074 B2

ARRAY SUBSTRATE, DISPLAY PANEL, AND ELECTRONIC APPARATUS

CROSS-REFERENCE TO RELATED APPLICATIONS

The present application is a continuation-application of International (PCT) Patent Application No. PCT/CN2018/096510, filed on Jul. 20, 2018, which claims foreign priority of Chinese Patent Application No. 201810086461.3, filed on Jan. 29, 2018 in the State Intellectual Property Office of China, the entire contents of which are hereby incorporated by reference.

TECHNICAL FIELD

The described embodiments relate to a technology of display, and more particularly, to an array substrate, a display panel, and an electronic apparatus.

BACKGROUND

With the continuous improvement of the display industry and the continuous improvement of display technology, consumers are no longer satisfied with the existing display mode, and the bezel-less screen with high screen ratio, large effective display area and more stunning display is gradually becoming a mainstream.

In order to meet the above-mentioned requirements, some irregular shaped screens have been developed, i.e., the shape of the display screen is no longer a regular rectangle. In the irregular shaped screen, how to set a wiring direction of the gate lines and the data lines has become a problem to be solved.

SUMMARY

The present disclosure provides an array substrate, a display panel, and an electronic apparatus, which may solve a technical problem of uneven distribution of gate lines or data lines and abnormal display image due to the irregular shape of the display panel.

In order to solve the above-mentioned technical problem, a technical solution adopted by the present disclosure is to provide an array substrate comprising: a plurality of gate lines each extending along a first linear direction; and a plurality of data lines each extending along a second linear direction, wherein the plurality of gate lines and the plurality of data lines are interlaced with each other, the second linear direction is substantially perpendicular to the first linear direction; wherein a length of each lateral edge of the array substrate is larger than a length of an upper edge and a lower edge of the array substrate, and a notch is defined on the upper edge; an angle between the first linear direction and the lateral edge of the array substrate is substantially 45 degrees, or an angle between the second linear direction and the lateral edge of the array substrate is substantially 45 degrees.

In order to solve the above-mentioned technical problem, a technical solution adopted by the present disclosure is to provide a display panel comprising an array substrate, a color filter substrate, and a liquid crystal layer between the array substrate and the color filter substrate; the array substrate comprising: a plurality of gate lines each extending along a first linear direction; and a plurality of data lines each extending along a second linear direction, wherein the plurality of gate lines and the plurality of data lines are interlaced with each other; wherein an angle between the first linear direction and the lateral edge of the array substrate is substantially equal to a preset angle such that the first linear direction is not parallel to any one of the lateral edge, an upper edge or a lower edge of the array substrate; or an angle between the second linear direction and the lateral edge of the array substrate is substantially equal to a preset angle such that the second linear direction is not parallel to any one of the lateral edge, an upper edge or a lower edge of the array substrate.

In order to solve the above-mentioned technical problem, a technical solution adopted by the present disclosure is to provide a technical solution adopted by the present disclosure is to provide an electronic apparatus comprising a display panel and a functional device; the display panel comprising an array substrate, a color filter substrate, and a liquid crystal layer between the array substrate and the color filter substrate; the array substrate comprising: a plurality of gate lines each extending along a first linear direction; and a plurality of data lines each extending along a second linear direction, wherein the plurality of gate lines and the plurality of data lines are interlaced with each other; wherein an angle between the first linear direction and the lateral edge of the array substrate is substantially equal to a preset angle such that the first linear direction is not parallel to any one of the lateral edge, the upper edge or the lower edge of the array substrate; or an angle between the second linear direction and the lateral edge of the array substrate is substantially equal to a preset angle such that the second linear direction is not parallel to any one of the lateral edge, the upper edge or the lower edge of the array substrate; a shape of the color filter substrate is corresponding to a shape of the array substrate.

According to the present disclosure, multiple gate lines and data lines interlaced with each other may be arranged on the array substrate. An angle between the wiring direction of the gate lines or the data lines may be a predetermined value which allows the wiring path of the gate lines or data lines to avoid the notch of the array substrate. In this circumstance, the gate lines and the data lines may be orderly and evenly arranged, and the arrangement of the gate lines and the data lines will not be too dense near the notch. Thus, the implementation of the present disclosure may solve the problem of uneven distribution of the gate lines and the data lines due to the irregular shape of the array substrate such that the display quality may be improved.

BRIEF DESCRIPTION OF THE DRAWINGS

In order to clearly illustrate the technical solutions of the present disclosure, the drawings used in the description of the embodiments will be briefly described. It is understood that the drawings described herein are merely some embodiments of the present disclosure. Those skilled in the art may derive other drawings from these drawings without inventive effort.

DETAILED DESCRIPTION

The detailed description set forth below is intended as a description of the subject technology with reference to the appended figures and embodiments. It is understood that the embodiments described herein include merely some parts of the embodiments of the present disclosure, but do not include all the embodiments. Based on the embodiments of the present disclosure, all other embodiments that those skilled in the art may derive from these embodiments are within the scope of the present disclosure.

A display area of an array substrate may include multiple pixel regions. Each of the pixel regions may refer to a rectangular area defined by two gate lines and two data lines, and a thin film transistor (TFT) and a pixel electrode may be arranged therein. The TFT may be a switch component.

The gate line and the data line may be mainly used to drive the pixel electrodes. In order to increase a screen ratio, an irregular shaped full screen starts to be adopted. An ideal state of a full screen is that the display area covers an entire front panel, but it is difficult to achieve by current technology. Accordingly, an irregular shaped screen has been provided, e.g., a display screen with a notch on one side.

Figure 1:
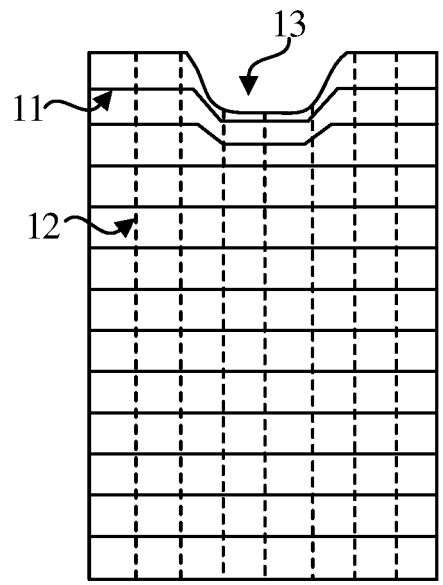
FIG. 1 is a structural illustration of multiple gate lines and multiple data lines arranged on an array substrate in related art.

Referring to FIG. 1, in order to improve the screen ratio of a display screen, a conventional full screen display panel needs to discard some functions, such as an earpiece or a front camera, to achieve a full screen display effect. However, a notch technology may improve the above-mentioned problem. In related art, the gate lines 11 or the data lines 12 must detour to avoid the notch. In this situation, the arrangement of the gate lines 11 and the data lines 12 may be uneven in the area near the notch 13 compared with that in the other area, and the risk of short circuit is increased. In an array substrate of the related art, multiple pixels distributed in an array manner are defined by horizontal gate lines 11 and vertical data lines 12 that are interlaced. Because the gate line 11 is horizontal, when a gate line 11 reaches the notch 13, it needs to detour around the notch 13, i.e., the wiring path of the corresponding gate line 11 is bent. Accordingly, the "horizontal" gate line 11 extends in a peripheral area of the notch 13, which makes the wiring arrangement in the peripheral area of the notch 13 denser.

When there are a large number of gate lines 11 in the peripheral position of the notch 13, a distribution of the pixels in the peripheral position of the notch 13 may be uneven. Specifically, a density the pixels in the peripheral position of the notch 13 may be larger than that of other areas, which may cause an unevenness of a display image and reduce a display effect.

Figure 2:
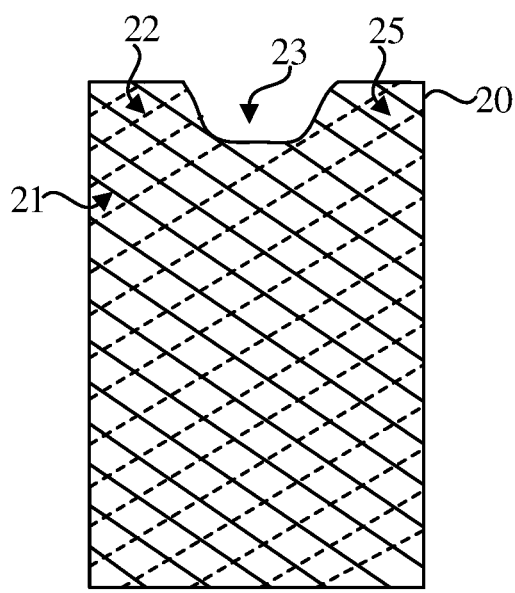
FIG. 2 is a structural illustration of multiple gate lines and multiple data lines arranged on an array substrate in accordance with an embodiment in the present disclosure.

Referring to FIG. 2, FIG. 2 is a structural illustration of multiple gate lines and multiple data lines arranged on an array substrate in accordance with an embodiment in the present disclosure.

An array substrate 20 may include multiple gate lines 21 each extending in a first linear direction and multiple data lines 22 each extending in a second linear direction. The multiple gate lines 21 and the multiple data lines 22 may be interlaced with each other and insulated from each other. The multiple gate lines 21 and the multiple data lines 22 may define multiple display pixels 25.

A notch 23 may be formed on one side of the array substrate 20. An angle between the first linear direction of the gate line 21 and an edge of the array substrate, or between the second linear direction of the data line 22 may be a preset angle θ. Therefore, the wiring path of at least one of the gate lines 21 or at least one of the data lines 22 may avoid the notch 23.

A shape of the notch 23 may be circular, rectangular, or the like. A position of the notch 23 may be set according to actual needs. For example, the notch 23 may be arranged on a center of an upper side of the array substrate 20, or may be arranged on a position close to any one of two upper corners of the upper side of the array substrate 20, or may be arranged on the left, right or lower side of the array substrate 20. A maximum length of the notch 23 may be smaller than a length of a side where the notch 23 is located.

Optionally, in an embodiment, the notch 23 may be arranged on a center position of an upper side of the array substrate 20. The notch 23 may be of a rectangular shape, and chamfers of the notch 23 may have an arc shape.

Figure 3:
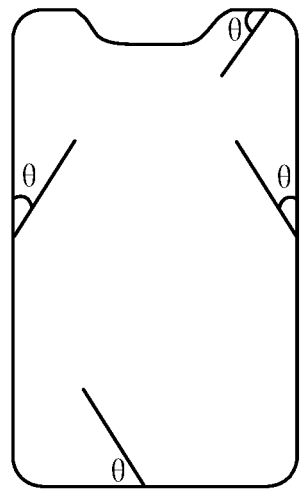
FIG. 3 is a schematic illustration of a tilt angle of multiple gate lines on an array substrate in accordance with an embodiment in the present disclosure.

Referring to FIG. 3, the angle between the first linear direction of the gate line 21 and a vertical edge (or a horizontal edge) of the array substrate may be equal to the preset angle θ. Similarly, the angle between the second linear direction of the data line 22 and a vertical edge (or a horizontal edge) of the array substrate may be equal to the preset angle θ. Since the chamfer of the notch 23 and the corners of the array substrate 20 may be rounded, the above-mentioned angle between the first linear direction of the gate line 21 (or the second liner direction of the data line 22) and the edge of the array substrate 20 does not refer to the angle between the first linear direction of the gate line 21 (or the second liner direction of the data line 22) and the chamfer of the notch 23, or the angle between the first linear direction of the gate line 21 (or the second liner direction of the data line 22) and the corner part of the array substrate 20.

Each of the gate lines 21 on the array substrate 20 may be connected to a gate driving circuit, and each of the data lines 22 may be connected to a data driving circuit. The gate driving circuit may output sequentially an appropriate turn-on voltage and a turn-off voltage to the gate line 21 based on a received clock signal to drive the TFT of each pixel to switch to a turn-on state or a turn-off state. The data driving circuit may be utilized to send input data signals to the pixel electrode of each pixel through the data lines 22 when the TFT is in the turn-on state. The gate driving circuit and the data driving circuit may be controlled by a timing controller.

As compared with the related art, multiple gate lines and data lines interlaced with each other may be arranged on the array substrate. An angle between the wiring direction of the gate lines or the data lines may be a predetermined value which allows the wiring path of the gate lines or data lines to avoid the notch of the array substrate. In this circumstance, the gate lines and the data lines may be orderly and evenly arranged, and the arrangement of the gate lines and the data lines will not be too dense near the notch. Thus, the implementation of the present disclosure may solve the problem of uneven distribution of the gate lines and the data lines due to the irregular shape of the array substrate such that the display quality may be improved.

Figure 4:
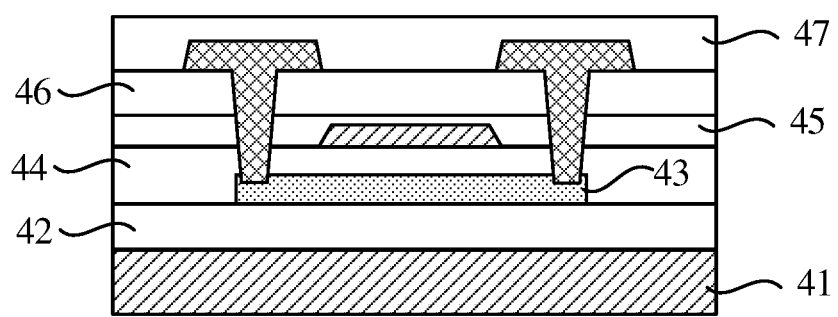
FIG. 4 is a structural illustration of an array substrate in accordance with another embodiment in the present disclosure.
Figure 5:
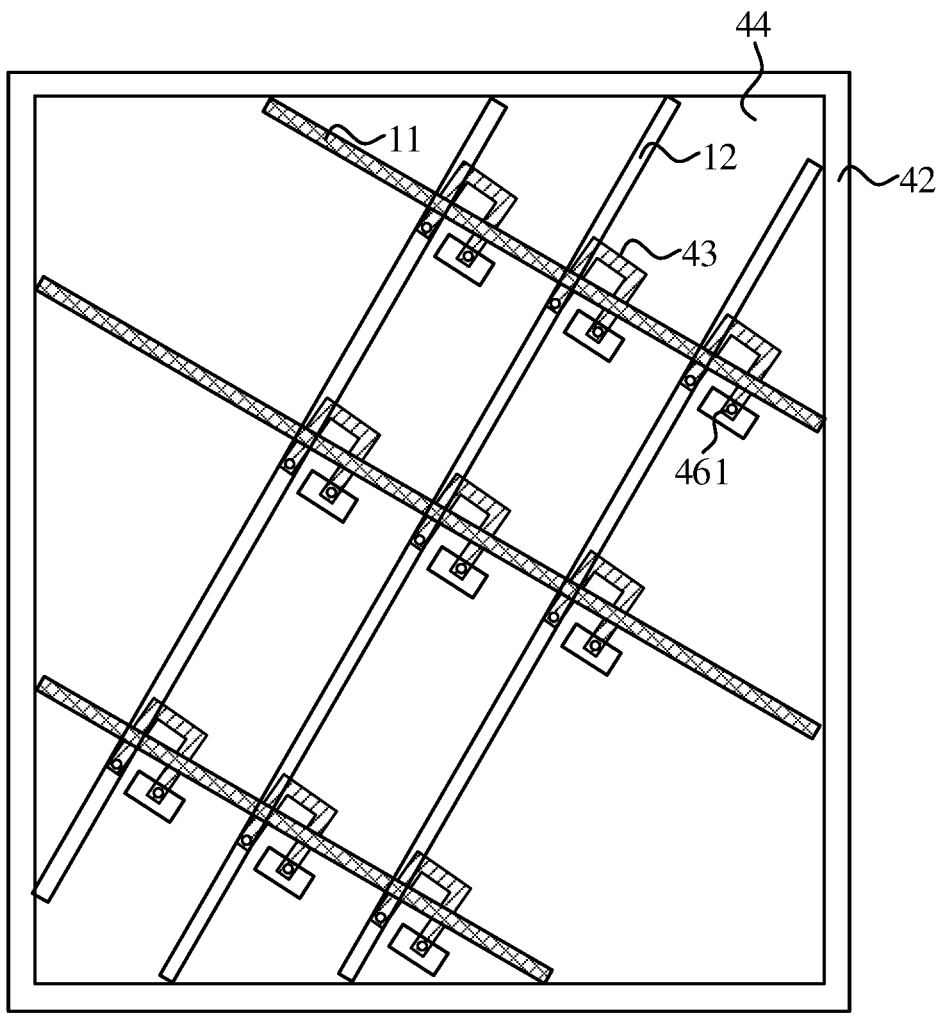
FIG. 5 is a schematic illustration of a wiring arrangement of an array substrate in accordance with another embodiment in the present disclosure.

Referring to FIG. 4 and FIG. 5, FIG. 4 is a structural illustration of an array substrate in accordance with another embodiment in the present disclosure. The array substrate may include a base substrate 41, a buffer layer 42, a semiconductor layer 43, a first insulating layer 44, a first metal layer 45, a second insulating layer 46, and a second metal layer 47 that are sequentially stacked. A manufacturing process of the array substrate may be shown as following.

The buffer layer 42 and an amorphous silicon layer may be sequentially formed on the base substrate 41, and the amorphous silicon layer may be subjected to a laser annealing treatment to form a polysilicon layer. The polysilicon layer may be subjected to an ion doping treatment, and ions may be implanted into the polysilicon layer to form the semiconductor layer 43.

The first insulating layer 44 may be formed on the semiconductor layer 43. The semiconductor layer 43 may be hydrogenated by hydrogen in the first insulating layer 44 as a hydrogen source. A material of the first insulating layer 44 may include one of silicon nitride, tantalum oxide, tantalum pentoxide, and zirconium dioxide.

The first metal layer 45 may be formed on the first insulating layer 44. The first metal layer 45 may be patterned to obtain a gate and a storage capacitor electrode.

The second insulating layer 46 may be formed on the first metal layer 45. A through hole may be formed on the second insulating layer 46. The through hole may be configured to form a path to connect a source and a drain to the semiconductor layer 43.

The second metal layer 47 may be formed on the second insulating layer 46, and the second metal layer 47 may be patterned to form the source and the drain.

The first metal layer 45 may be patterned to form multiple gate lines 21, and the second metal layer 47 may be patterned to form multiple data lines 22. Materials of the first metal layer 45 and the second metal layer 47 may be molybdenum or tantalum.

The second metal layer 47 may be further configured to form the source and the drain. The source and the drain may be connected to the semiconductor layer 43 via the through hole on the second insulating layer 46. One of the source and the drain may be connected to the data line 22, and the other of the source and the drain may be connected to the pixel electrode.

Referring to FIG. 5, the array substrate 20 may include an upper edge, a lower edge and two opposite lateral edges. The length of the lateral edge may be larger than the length of the upper edge or the lower edge. The array substrate 20 may further include multiple gate lines 21 each extending along a first linear direction and multiple data lines 22 each extending along a second linear direction. The multiple gate lines 21 and the multiple data lines 22 may be interlaced with each other. The upper edge of the array substrate may define a notch 23. An angle between the first linear direction of the gate line 21 and an edge of the array substrate may be substantially 45 degrees, or an angle between the second linear direction of the data line 22 and an edge of the array substrate may be substantially 45 degrees. The first linear direction of the gate line 21 and the second linear direction of the data line 22 may be substantially perpendicular to each other.

Figure 6:
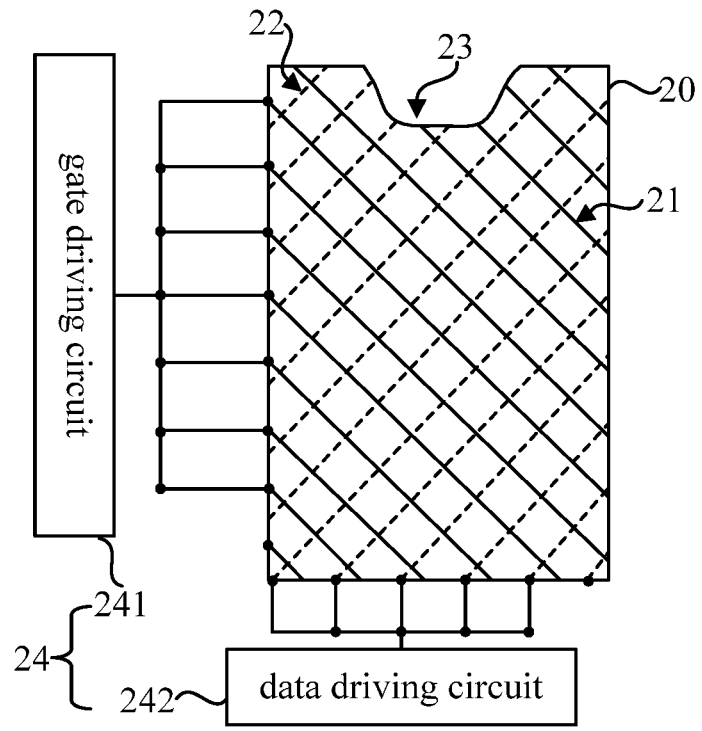
FIG. 6 is a structural illustration of an array substrate in accordance with another embodiment in the present disclosure.

Referring to FIG. 6, the array substrate 20 may further include a driving circuit 24, and the array substrate may further a demultiplexer and an integrated circuit which may be coupled with the driving circuit (not shown in figure). The driving circuit may be connected to the gate lines 21 and/or the data lines 22. The driving circuit 24 may include at least one gate driving circuit 241 and at least one data driving circuit 242. The gate driving circuit 241 may be connected to the plurality of gate lines 21 and the data driving circuit 242 may be connected to the plurality of data lines 22. That is, each of the gate lines 21 or the data lines 22 may be connected to one of the gate driving circuits 241 or the data driving circuits 242.

Figure 7:
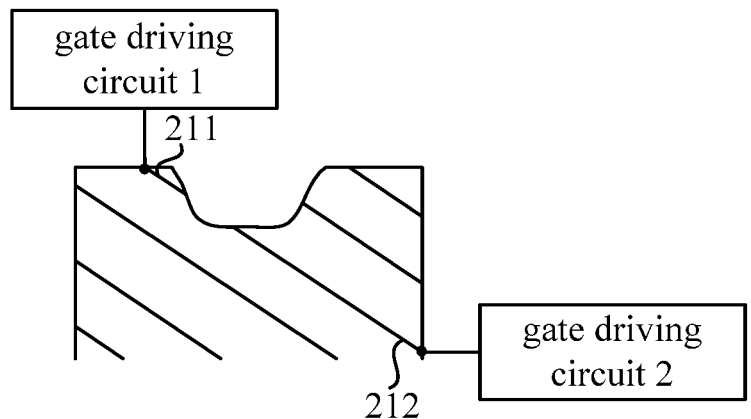
FIG. 7 is another structural illustration of an array substrate in accordance with another embodiment in the present disclosure.

Referring to FIG. 7, when extension lines of two gate lines 211 and 222 are overlapped, the gate line 211 may be connected to the gate driving circuit 1 and the gate line 222 may be connected to the gate driving circuit 2, such that the gate lines 211 and 222 do not need to detour around the notch.

In present disclosure, the wiring arrangement of the gate lines 21 and the data lines 22 may allow the gate lines 21 and the data lines 22 to avoid the notch 23. Even if the extension lines of two gate lines 21 or two data lines 22 are overlapped, the two gate lines 21 or the two data lines 22 may be respectively connected to different gate driving circuits or data driving circuits such that the two gate lines 21 or the two data lines 22 do not need to detour around the notch.

As compared with the related art, the array substrate provided in the present disclosure may include multiple gate lines and multiple data lines interlaced with each other. The angle between the first linear direction along which the gate line extends and an edge of the array substrate may be substantially 45 degrees, or the angle between the second linear direction along which the data line extends and an edge of the array substrate may be substantially 45 degrees. In this situation, the wiring paths of the gate lines and the data lines may avoid the notch of the array substrate. The gate lines and the data lines may be orderly and evenly arranged. The wiring arrangement of the gate lines and the data lines in the peripheral area of the notch will not be too dense. Therefore, the implementation of the present disclosure may solve the problem of uneven distribution of the gate lines or the data lines due to the irregular shape of the array substrate, such that the display quality may be improved.

Figure 8:
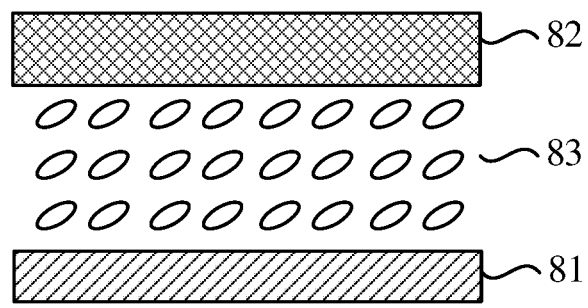
FIG. 8 is a structural illustration of a display panel in accordance with an embodiment in the present disclosure.

Referring to FIG. 8, FIG. 8 is a structural illustration of a display panel in accordance with an embodiment in the present disclosure. The display panel may be a liquid crystal display panel or an organic light-emitting diode panel including an array substrate same as that described in any one of the above-mentioned embodiments. For example, the display panel may include an array substrate 81, a color filter substrate 82, and a liquid crystal layer 83 between the array substrate 81 and the color filter substrate 82. The array substrate 81 may be the array substrate of any one of the above-mentioned embodiments.

Figure 9:
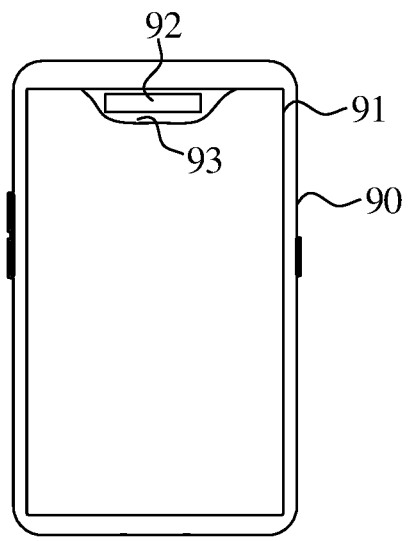
FIG. 9 is a structural illustration of an electronic apparatus in accordance with an embodiment in the present disclosure.

Referring to FIG. 9, FIG. 9 is a structural illustration of an electronic apparatus in accordance with an embodiment in the present disclosure. The electronic apparatus 90 may include a display panel 91 of the above-mentioned embodiment and at least one functional device 92 arranged at a position corresponding to the position of the notch 93 of the display panel. The functional device 92 may be a loudspeaker, a sensor or a front camera, and the electronic apparatus 90 may be an apparatus such as a mobile phone, a tablet computer or an e-book reader.

It is understood that the descriptions above are only embodiments of the present disclosure. It is not intended to limit the scope of the present disclosure. Any equivalent transformation in structure and/or in scheme referring to the instruction and the accompanying drawings of the present disclosure, and direct or indirect application in other related technical field, are included within the scope of the present disclosure.

What is claimed is:

1. An array substrate comprising:
a plurality of gate lines each extending along a first linear direction; and
a plurality of data lines each extending along a second linear direction, wherein the plurality of gate lines and the plurality of data lines are interlaced with each other, the second linear direction is substantially perpendicular to the first linear direction;
wherein
a length of each lateral edge of the array substrate is larger than a length of an upper edge and a lower edge of the array substrate, and a notch is defined on the upper edge;
an angle between the first linear direction and the lateral edge of the array substrate is substantially 45 degrees, or an angle between the second linear direction and the lateral edge of the array substrate is substantially 45 degrees;
wherein when a gate line is interfered by the notch, the gate line interfered by the notch is divided into two gate lines extended from the notch in two opposite directions, and located on a same line.

2. The array substrate according to claim 1, further comprising a driving circuit connected to the plurality of gate lines and the plurality data lines.

3. The array substrate according to claim 2, wherein the driving circuit comprises at least one gate driving circuit and at least one data driving circuit; and
the gate driving circuit is connected to the plurality of gate lines, and the data driving circuit is connected to the plurality of data lines.

4. The array substrate according to claim 3, wherein two gate lines extended from the notch in two opposite directions are connected to different ones of the at least one gate driving circuit.

5. The array substrate according to claim 2, wherein the array substrate further comprises a demultiplexer and an integrated circuit; and
the demultiplexer and the integrated circuit are coupled with the driving circuit.

6. A display panel comprising an array substrate, a color filter substrate, and a liquid crystal layer between the array substrate and the color filter substrate;
the array substrate comprising:
a plurality of gate lines each extending along a first linear direction; and
a plurality of data lines each extending along a second linear direction, wherein the plurality of gate lines and the plurality of data lines are interlaced with each other;
wherein
an angle between the first linear direction and the lateral edge of the array substrate is substantially equal to a preset angle such that the first linear direction is not parallel to any one of the lateral edge, an upper edge or a lower edge of the array substrate; or
an angle between the second linear direction and the lateral edge of the array substrate is substantially equal to a preset angle such that the second linear direction is not parallel to any one of the lateral edge, an upper edge or a lower edge of the array substrate;
wherein when a gate line is interfered by the notch, the gate line interfered by the notch is divided into two gate lines extended from the notch in two opposite directions, and located on a same line.

7. The display panel according to claim 6, wherein the preset angle is 45 degrees, and the second linear direction is substantially perpendicular to the first linear direction.

8. The display panel according to claim 6, wherein the array substrate further comprises a driving circuit connected to the plurality of gate lines and the plurality of data lines.

9. The display panel according to claim 8, wherein the driving circuit comprises at least one gate driving circuit and at least one data driving circuit; and
the gate driving circuit is connected to the plurality of gate lines, and the data driving circuit is connected to the plurality of data lines.

10. The display panel according to claim 9, wherein two gate lines extended from the notch in two opposite directions are connected to different ones of the at least one gate driving circuit.

11. The display panel according to claim 8, wherein the array substrate further comprises a demultiplexer and an integrated circuit; and
the demultiplexer and the integrated circuit are coupled with the driving circuit.

12. The display panel according to claim 6, wherein a length of the lateral edge of the array substrate is larger than a length of the upper edge and the lower edge of the array substrate, and a notch is defined on the upper edge.

13. An electronic apparatus with a display panel and a functional device; the display panel comprising an array substrate, a color filter substrate, and a liquid crystal layer between the array substrate and the color filter substrate;
the array substrate comprising:
a plurality of gate lines each extending along a first linear direction; and
a plurality of data lines each extending along a second linear direction, wherein the plurality of gate lines and the plurality of data lines are interlaced with each other;
wherein
an angle between the first linear direction and the lateral edge of the array substrate is substantially equal to a preset angle such that the first linear direction is not parallel to any one of the lateral edge, the upper edge or the lower edge of the array substrate; or
an angle between the second linear direction and the lateral edge of the array substrate is substantially equal to a preset angle such that the second linear direction is not parallel to any one of the lateral edge, the upper edge or the lower edge of the array substrate;
a shape of the color filter substrate is corresponding to a shape of the array substrate;
wherein when a gate line is interfered by the notch, the gate line interfered by the notch is divided into two gate lines extended from the notch in two opposite directions, and located on a same line.

14. The electronic apparatus according to claim 13, wherein
a length of each lateral edge of the array substrate is larger than a length of an upper edge and a lower edge of the array substrate, and a notch is defined on the upper edge;
an angle between the first linear direction and the lateral edge of the array substrate is substantially 45 degrees, or an angle between the second linear direction and the lateral edge of the array substrate is substantially 45 degrees.

15. The electronic apparatus according to claim 13, wherein the array substrate further comprises a driving circuit connected to the plurality of gate lines and the plurality of data lines.

16. The electronic apparatus according to claim 15, wherein the driving circuit comprises at least one gate driving circuit and at least one data driving circuit; and
the gate driving circuit is connected to the plurality of gate lines, and the data driving circuit is connected to the plurality of data lines.

17. The electronic apparatus according to claim 16, wherein
two gate lines extended from the notch in two opposite directions are connected to different ones of the at least one gate driving circuit.

18. The electronic apparatus according to claim 16, wherein
the array substrate further comprises a demultiplexer and an integrated circuit; and
the demultiplexer and the integrated circuit are coupled with the gate driving circuit.

19. The electronic apparatus according to claim 13, wherein
a length of each lateral edge of the array substrate is larger than a length of an upper edge and a lower edge of the array substrate, and a notch is defined on the upper edge.

20. The electronic apparatus according to claim 13, further comprising at least one functional device arranged on a position where the notch of the display panel is located.

* * * * *